(12) United States Patent
Gao

(10) Patent No.: US 11,523,534 B2
(45) Date of Patent: Dec. 6, 2022

(54) DEVICE FOR AIRFLOW MANAGEMENT AND COOLING IMPROVEMENT IN HYBRID-COOLED ELECTRONICS

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 17/148,063

(22) Filed: Jan. 13, 2021

(65) Prior Publication Data

US 2022/0225531 A1   Jul. 14, 2022

(51) Int. Cl.
  *H05K 7/20* (2006.01)

(52) U.S. Cl.
  CPC ..... *H05K 7/20145* (2013.01); *H05K 7/20254* (2013.01); *H05K 7/20727* (2013.01); *H05K 7/20772* (2013.01)

(58) Field of Classification Search
  CPC ........... H05K 7/20145; H05K 7/20254; H05K 7/20718–20736; H05K 7/20763–20781; G06F 1/20
  See application file for complete search history.

(56) References Cited

U.S. PATENT DOCUMENTS

| | | | | |
|---|---|---|---|---|
| 6,330,155 B1 * | 12/2001 | Remsburg | .......... | H05K 7/20154 |
| | | | | 236/49.5 |
| 6,991,533 B2 * | 1/2006 | Tsai | ..................... | H05K 7/2019 |
| | | | | 361/695 |
| 8,395,899 B2 * | 3/2013 | Li | ........................... | G06F 1/187 |
| | | | | 361/679.33 |
| 9,795,055 B1 * | 10/2017 | Campbell | ................. | G06F 1/20 |
| 9,961,796 B1 * | 5/2018 | Peng | .................. | H05K 7/20727 |
| 10,624,241 B1 | 4/2020 | Ross et al. | | |
| 10,631,432 B2 * | 4/2020 | Gopalakrishna | ... | H05K 7/20181 |
| 11,089,713 B2 * | 8/2021 | Escamilla | .......... | H05K 7/20181 |
| 2003/0224717 A1 | 12/2003 | Tsai et al. | | |
| 2009/0262499 A1 * | 10/2009 | Chou | ................. | H05K 7/20181 |
| | | | | 361/695 |
| 2013/0026404 A1 | 1/2013 | Tan | | |
| 2013/0107441 A1 * | 5/2013 | Zhou | ....................... | G06F 1/185 |
| | | | | 248/298.1 |
| 2015/0055296 A1 * | 2/2015 | Joko | .................. | H05K 7/20145 |
| | | | | 165/96 |
| 2018/0066663 A1 * | 3/2018 | Kulkarni | ............ | H05K 7/20772 |
| 2018/0376614 A1 * | 12/2018 | Xiong | ................ | H05K 7/20181 |

FOREIGN PATENT DOCUMENTS

TW          M597825 U        7/2020

* cited by examiner

*Primary Examiner* — Zachary Pape
(74) *Attorney, Agent, or Firm* — Womble Bond Dickinson (US) LLP

(57) ABSTRACT

Embodiments are disclosed of a baffle unit. The baffle unit includes an elastic member and one or more baffle blades. Each baffle blade has a first edge and a second edge, and each baffle blade has its first edge coupled to the elastic member, so that each baffle blade rotates about and deforms the elastic member in response to aerodynamic forces applied to the one or more baffle blades. Implementation of one or more of the baffle units preventing or reduces thermal impact of the airflow on liquid cooling devices and enables airflow management optimization.

18 Claims, 7 Drawing Sheets

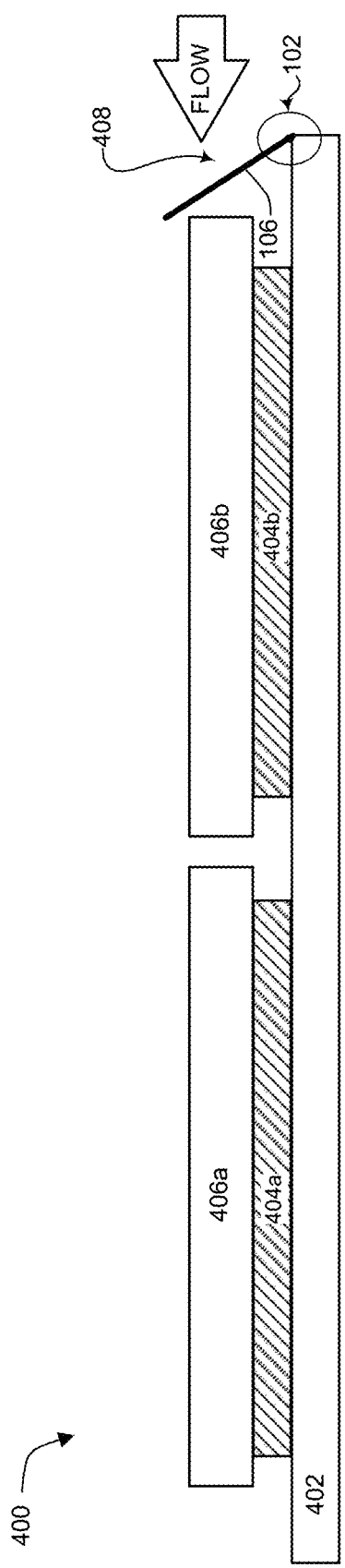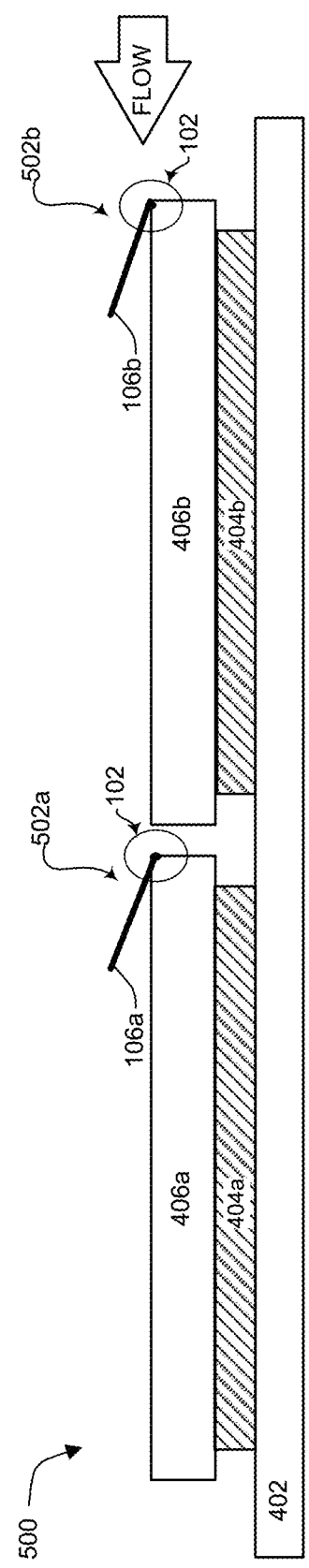

DEVICE FOR AIRFLOW MANAGEMENT AND COOLING IMPROVEMENT IN HYBRID-COOLED ELECTRONICS

TECHNICAL FIELD

The disclosed embodiments relate generally to hybrid cooling systems for temperature control of electronic equipment and in particular, but not exclusively, to a device for improving liquid cooling by managing airflow in hybrid-cooled electronics.

BACKGROUND

Much modern information technology (IT) equipment such as servers, blade servers, routers, edge servers, etc., generates a substantial amount of heat during operation. The heat generated by individual components—especially high-power components such as processors and SoC which includes multiple chiplets—makes many of these individual components impossible or difficult to cool effectively with air cooling systems. Modern IT equipment therefore requires liquid cooling or liquid-air hybrid cooling—i.e., cooling with a combination of air cooling and liquid cooling.

As a result of the requirement for liquid cooling, some pieces of IT equipment have an on-board liquid cooling system that is thermally coupled, using elements such as cold plates, to individual components that need cooling. These designs improve the thermal capability by locating the cooling liquid closer to the heat source. But these on-board liquid cooling systems usually do not operate in isolation. They are usually coupled to at least one larger cooling system, such as liquid cooling system in an electronics rack, and the rack's cooling system can further be coupled to the liquid cooling system of a larger facility such as a data center. In such a system, the data center's cooling system circulates a working fluid through the rack cooling system, which in turn circulates the working fluid through the cooling system on the piece of IT equipment.

If a hybrid cooling system is not carefully managed, the air cooling and liquid cooling can work against each other, or may cause a negative impact on each other, decreasing the efficiency and effectiveness of the system as a whole. To prevent loss of heat from the liquid system to the air, previous solutions put high thermal resistance material on the lid of the cooling device or add additional heat loss prevention material on the top. These designs add thermal resistance to prevent heat loss through convection. The shortfalls of these method are not flexible and ease of implementation, does not provide better airflow management by only function as blockage. Another existing solution is using traditional air baffle, but most current air baffles are highly dependent on the server chassis as well as the server internal layout. This means each of the air baffle is customized only for specific layout and function. As a result, existing air baffles are not very scalable.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 1A is an exploded view, FIG. 1B an assembled view.

FIG. 2A is a front view, FIG. 2B a side view.

FIGS. 4-5 are side views of embodiments of mounted baffle units in an embodiment of a hybrid cooling system.

DETAILED DESCRIPTION

Figure 1A:
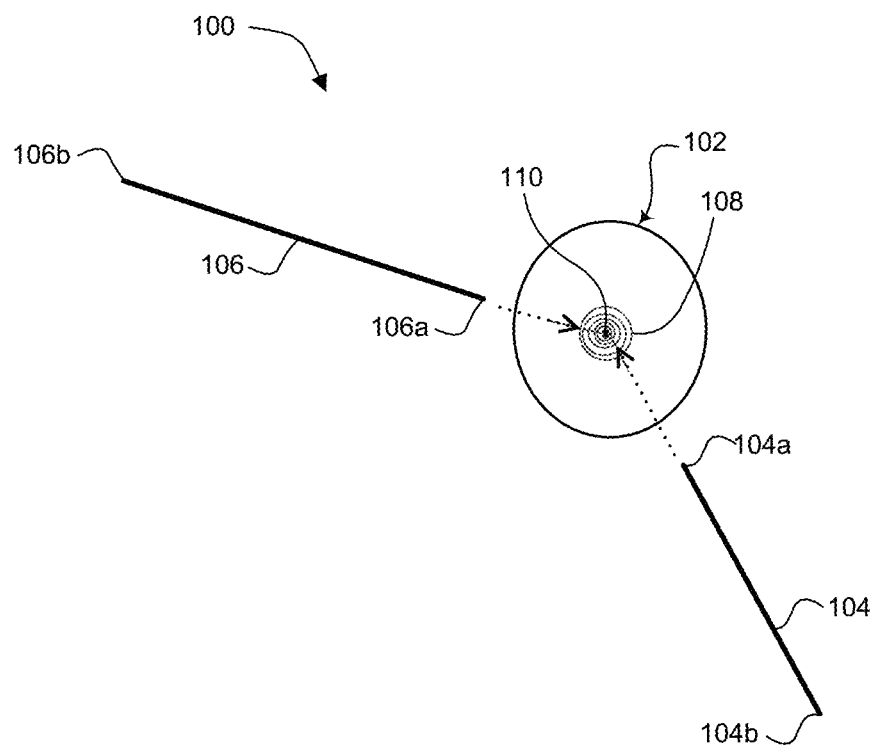
FIGS. 1A-1B are side-views of an embodiment of a baffle unit.

Embodiments are described of a baffle unit for improving airflow management, and thus improving cooling, in a hybrid-cooled system. Specific details are described to provide an understanding of the embodiments, but one skilled in the relevant art will recognize that the invention can be practiced without one or more of the described details or with other methods, components, materials, etc. In some instances, well-known structures, materials, or operations are not shown or described in detail but are nonetheless encompassed within the scope of the invention.

Reference throughout this specification to "one embodiment" or "an embodiment" means that a described feature, structure, or characteristic can be included in at least one described embodiment, so that appearances of "in one embodiment" or "in an embodiment" do not necessarily all refer to the same embodiment. Furthermore, the particular features, structures, or characteristics may be combined in any suitable manner in one or more embodiments. As used in this application, directional terms such as "front," "rear," "top," "bottom," "side," "lateral," "longitudinal," etc., refer to the orientations of embodiments as they are presented in the drawings, but any directional term should not be interpreted to imply or require any particular orientation of the described embodiments when in actual use.

A device and approach are proposed to improve liquid cooling system performance, especially in hybrid cooling systems that cool with both air and liquid. The device includes mounting structures as well as baffle structures. Two major units are used for the baffle structure: a rotation unit and a blade. The rotation part is integrated with a flexible spring to control different opening ratios of the blade under different air pressures. This design ensure a proper and dynamically adjustable air flow resistance introduced to the air stream. The device is then mounted to the chassis and use as approach for blocking and directing the airflow away from the liquid cooling devices and, at the same time, assisting the airflow to the targeted heat loads. The device can be an independent unit from the liquid cooling devices, but it also can be designed as an integrated unit on the cooling device. The entire structural design enables flexible integration methods in different server chassis and board layout.

The disclosed embodiments are used in liquid cooling system that use liquid cooling components such as cold plates that are directly attached to heat-generating electronics. Most uses of these solutions are in a hybrid cooling environment, which means that cooling air is still supplied for thermal management of devices that are air-cooled. The airflow can adversely impact the liquid cooling device through convection, especially forced convection, because some of the heat captured by the liquid can be extracted to the airflow before it is transferred to the external liquid heat transfer loop. This can impact the cooling performance on both the IT side and the facility side, and can also decrease the system efficiency. The liquid cooling devices can also introduce negative impact on the air cooling by functioning as airflow blockages, so that a separation of liquid cooled electronics and the electronics liquid cooling devices with the cooling air can also benefit the air cooling system. The disclosed embodiments also aim to improve the airflow management by minimizing the airflow resistance.

The disclosed embodiments also aim to improve device availabilities and scalabilities, which means the design can be used for different types of systems and different uses. This not only decreases the cost associated with the hardware design, but also decreases the amount of system-level design needed to implement the device. The method can be used for designing and assembling different actual products for CPU, GPU and so on. With the increasing of the performance and the power packaged on a chip or processor, cooling is becoming critical to ensure a proper function and performance.

The disclosed embodiments provide an advanced device that can be flexibly used for different scenarios, including different servers and airflow management requirements. The embodiments can be used in a system with multiple components and can be implemented on individual components. In addition, the embodiments enable flexible implementation and mounting methods in target locations, while enhancing airflow management by diverting the airflow instead of simply blocking the airflow. And, importantly, the airflow resistance introduced by the device is dynamically adjusted under the variation of the airflow speed.

Figure 1B:
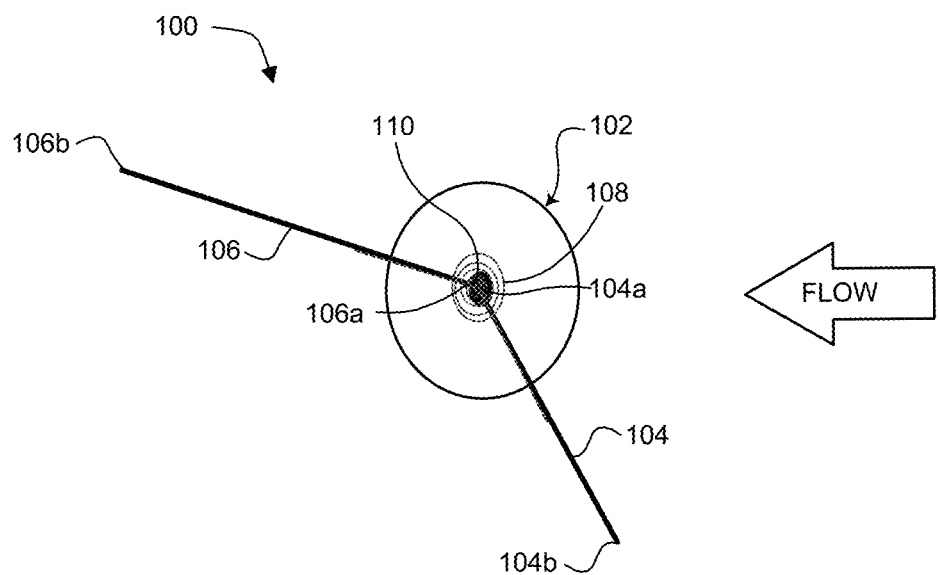

FIGS. 1A-1B together illustrate an embodiment of a baffle unit 100. FIG. 1A is an exploded view, FIG. 1B an assembled view. Baffle unit 100 includes a rotation unit 102 that is coupled to a pair of baffle blades 104 and 106. The illustrated embodiment includes two baffle blades, but other embodiments of baffle unit 100 can use a single baffle blade (see, e.g., FIG. 5).

Rotation unit 102 includes an elastic member 108 positioned around a shaft 110. In one embodiment elastic member 108 can be a torsion spring, but other embodiments can use a different type of elastic member. Other embodiments can also omit shaft 110, so that rotation unit 102 includes only elastic member 108.

Baffle blades 104 and 106 each include at least a first edge and a second edge: baffle blade 104 includes first edge 104a and second edge 104b, while baffle blade 106 includes first edge 106a and second edge 106b. In one embodiment, baffle blades 104 and 106 can be quadrilateral (e.g., square or rectangular), but in other embodiments the baffle blades can have non-quadrilateral shapes. In still other embodiments baffle blades 104 and 106 need not have the same shape, quadrilateral or otherwise. In an embodiment where baffle blades 104 and 106 are rectangular, the first edge and second edge of each baffle are the long edges of the rectangle.

In the illustrated embodiment the first edges of each baffle blade—i.e., first edge 104a and first edge 106a—are coupled to rotation unit 102. In an embodiment of rotation unit 102 that includes shaft 110, first edge 104a and first edge 106a can be rotatably coupled to shaft 110 so that each can rotate about the shaft and so that the relative angle between baffle blades 102 and 104 can change. In an embodiment of rotation unit 102 that doesn't include shaft 110, first edge 104a first edge 106a can be coupled to elastic member 108 so that each baffle blade rotates about the center of the elastic member and the relative angle between baffle blades can change.

In different embodiments of baffle unit 100, the second edge of each baffle blade—i.e., second edge 104b and second edge 106b—can be:

1. fixed to another element (i.e., it can neither rotate nor translate relative to the element) or fixed to the main frame;
2. rotatably fixed to another element (i.e., it can rotate about the element but can't translate relative to it);
3. translatably and rotatably fixed to another element (i.e., it can rotate about the element and can translate with the element or relative to the element); or
4. free (i.e., unattached to another element).

In some embodiments that include two baffle blades, at least one of second edge 104b and second edge 106b will be free; in one illustrated embodiment of baffle unit 100, second edge 104b is fixed and second edge 106b is free. In embodiments that include only a single baffle blade, elastic member 108 and/or shaft 110 (if present) can be fixed, so that the first edge of the attached baffle blade is also fixed and the second end is free. In some embodiments, the second edge of one of the baffle blades 104 and 106 can also be coupled to an additional rotation unit 152 (see, e.g., FIG. 1C).

In operation of baffle unit 100, air flows from right to left, as shown by the arrow in the figure. In one embodiment the airflow source can be natural convection, but in other embodiments the airflow can be forced convection driven by an element such as a fan. As air flows over the baffle unit, it exerts an aerodynamic force on the baffle unit, more specifically on baffle blades 104 and 106. As noted above, in one illustrated embodiment of baffle unit 100 second edge 104b is fixed, second edge 106b is free, and rotation unit 102 is also free. The aerodynamic forces on baffle blades 104 and 106 causes elastic member 108 to deflect and exert a moment about the center of elastic member 108 and shaft 110 (if present). Elastic member 108, as a result of its elasticity, thus exerts a restoring force on the baffle blades 104 and 106 opposite to the aerodynamic force on the baffle blades. As the aerodynamic force increases, so does the force exerted by elastic member 108, until the forces are in equilibrium, at which point:

$$-Ks_{x\,negative\,airflow\,direction} = p_d A = \frac{1}{2}\rho v^2 A.$$

In this equation, based on a force analysis of baffle blade 106 (as an example) the term −K is the elastic spring force component in a direction opposite the airflow and $p_d A$ represents the aerodynamic force in the airflow direction. K is the spring constant of elastic member 108, $s_x$ is the deflection of elastic member 108 in the flow direction, $p_d$ is the dynamic pressure of the airflow, A is a reference area of the baffle blade, $\rho$ is the air density, and $v$ is the airflow speed. Once it has achieved its equilibrium position, baffle unit 100 shelters any components that are behind it (i.e., on the side of baffle unit opposite the origin of the airflow; see, e.g., FIG. 2B) from exposure to the airflow. As characteristics of the airflow such as speed or density change, the baffle unit automatically adapts to a new equilibrium position where the above equation is satisfied. Thus, because it is an elastic structure, the baffle unit automatically adjusts according to the air pressure and, by selecting proper elasticity coefficient for elastic member 108, better airflow management efficiency can be achieved since the resistance is dynamically adjusted. This means the flow resistance is automatically and dynamically adjusted and optimized based on the airflow rates.

Figure 1C:
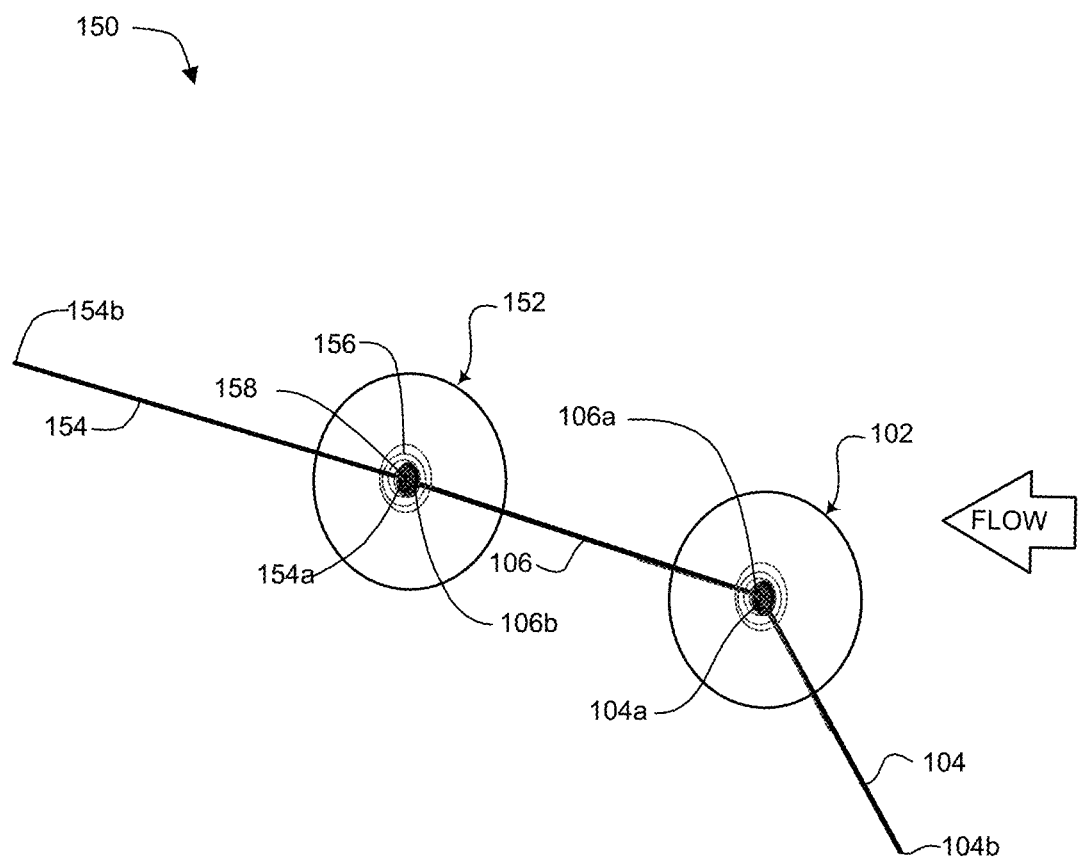
FIG. 1C is a side view of another embodiment of a baffle unit.

FIG. 1C illustrates an embodiment of a baffle unit 150. In some embodiments baffle unit 100, shown in FIGS. 1A-1B, can be extended by adding further rotation units and baffle blades; baffle unit 150 is such an extended embodiment of baffle unit 100. Baffle unit 150 includes all the elements of baffle unit 100, but also includes an additional rotation unit 152 coupled to the second edge of baffle blade 106 and also includes an additional baffle blade 154 whose first edge 154a is coupled to the additional rotation unit 152. As with rotation unit 102, rotation unit 152 includes an elastic member 156 positioned around a shaft 158. In one embodiment elastic member 156 is a torsion spring, but other embodiments can use a different type of elastic member. Other embodiments can also omit shaft 158, so that rotation unit 152 includes only elastic member 156.

Additional baffle blade 154 include at least a first edge 154a and a second edge 154b. In one embodiment, baffle blade 154 can be quadrilateral (e.g., square or rectangular), but in other embodiments the baffle blade can have a non-quadrilateral shape, and in still other embodiments baffle blade 154 need not have the same shape as baffle blades 104 and 106. In an embodiment where baffle blade 154 is rectangular, first edge 154a and second edge 154b can be the long edges of the rectangle. In the illustrated embodiment of baffle unit 150, first edge 154a is coupled to elastic member 156 and, if present, to shaft 158, and second edge 154b is free. Baffle unit 150 operates similarly to baffle unit 100, except that restoring forces used by the baffle unit to counter aerodynamic forces are now provided by two rotation units instead of one.

Figure 2A:
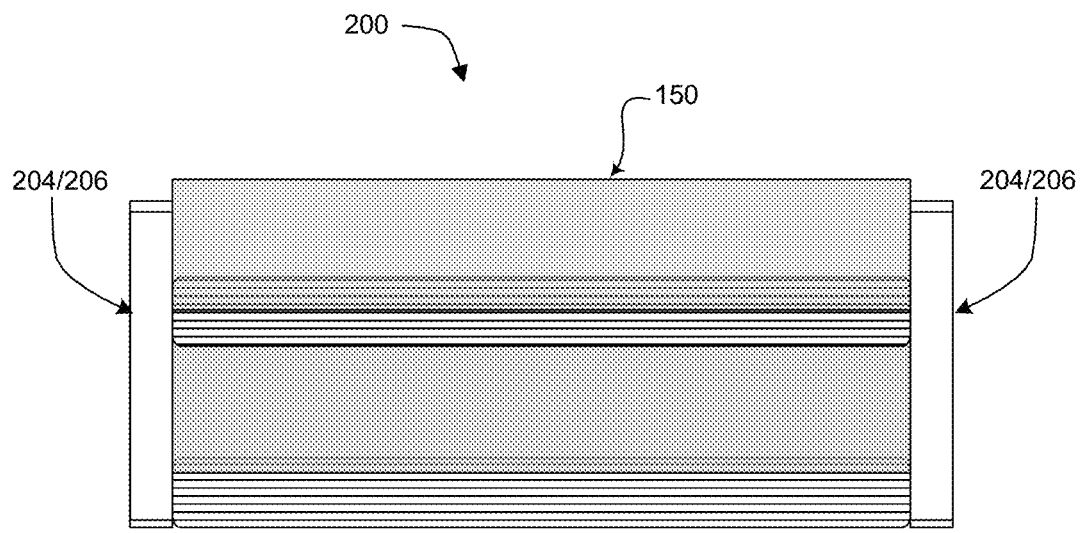
FIGS. 2A-2B are diagrams of an embodiment of a mounting structure that can be used to mount embodiments of baffle units.
Figure 2B:
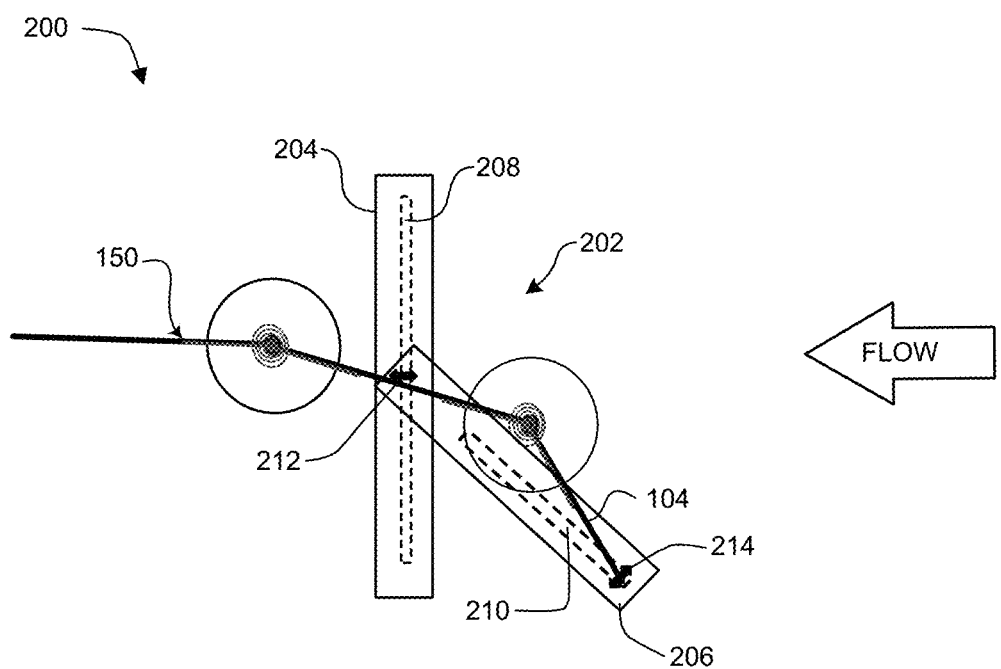

FIGS. 2A-2B together illustrate an embodiment of a baffle system 200. FIG. 2A is a front view, FIG. 2B a side view. Baffle system 200 includes a baffle unit such as baffle unit 150 (see FIG. 1C) and a mounting frame 202 used to secure baffle unit 150 to a component such as a substrate (see FIGS. 3-7). Other embodiments of baffle system 200 can use different embodiments of a baffle unit, such as baffle unit 100 (see FIGS. 1A-1B).

Mounting frame 202 includes a vertical support 204 and an angled support 206. Vertical support 204 includes a fixing channel 208 and angled support 206 includes a fixing channel 210. Other embodiments of mounting frame 202 can use more or less supports than shown, and in other embodiments the supports need not be in the illustrated position or have the illustrated relationship to each other. Fixing channels 208 and 210 allow baffle unit 150 to be coupled to the mounting frame, as well as allowing vertical support 204 to be coupled to angled support 206 in a way that the angled support can move relative to the vertical support, thus adjusting the position of baffle unit 150. In the illustrated embodiment, second edge 104b of baffle blade 104 is movably fixed in fixing channel 210 using a fixing knob 214. Similarly, an end of angled support 206 is movably fixed in fixing channel 208 using a fixing knob 212. This arrangement yields two ways to adjust the mounting frame and baffle unit 150. The angle of angled support 206 relative to vertical support 204, as well as the angle of baffle blade 104 relative to the airflow, can be adjusted by moving fixing knob 212, and thus the end of angled support 206, up and down within fixing channel 208. And the angle of baffle blade 104 relative to the airflow, and thus the angle of baffle assembly 150, can additionally be adjusted by moving fixing knob 214 within fixing channel 210. This ensures a better airflow blocking and at the same time eliminates the impact on the airflow by minimizing the resistance introduced by the device. The fact that both the vertical and angled supports have fixing channels provides more implementation flexibility.

Figure 3:
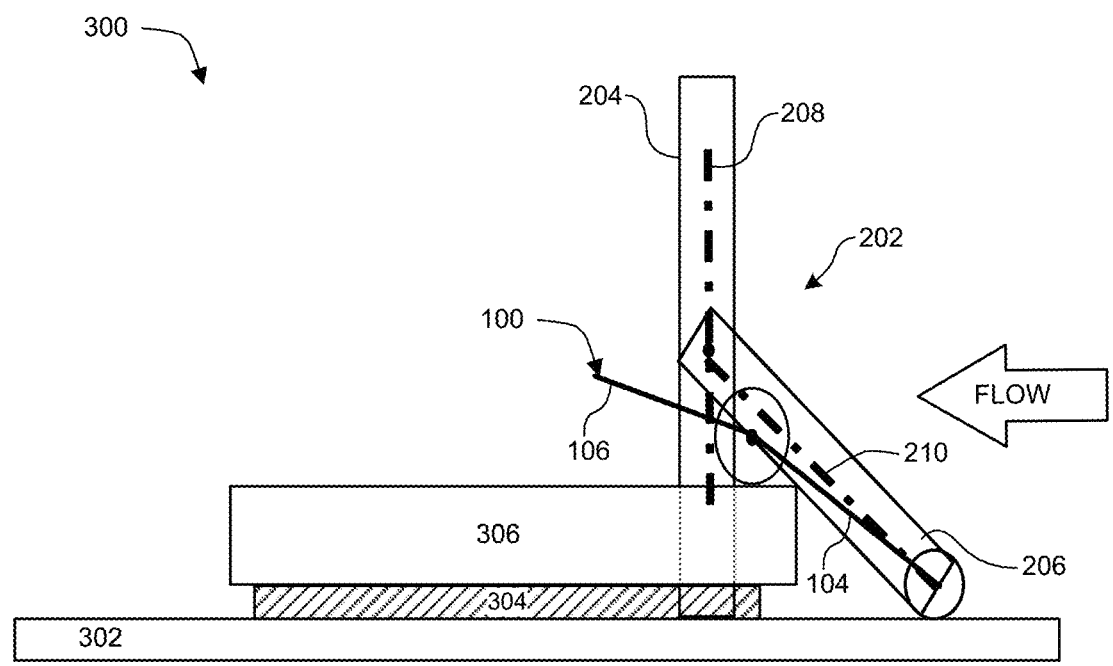
FIG. 3 is a side view of an embodiment of a baffle unit mounted on a substrate using a mounting structure such as the one shown in FIGS. 2A-2B.

FIG. 3 illustrates an embodiment of a hybrid cooling system 300 using an embodiment of a baffle system such as baffle system 200. In hybrid cooling system 300, a processor or other heat-generating electronic component 304 is mounted on a substrate 302. In one embodiment substrate 302 can be printed circuit board, but in other embodiments it can be another kind of substrate. A cold plate 306 is thermally coupled to component 304, so that heat is transferred from heat-generating component 304 into liquid flowing through the cold plate. Although not shown in the drawing, other fluid components (e.g., hoses, pumps, heat exchangers, valves, etc.) are coupled to cold plate 306 to circulate cooling fluid through the cold plate. Other heat-generating electronic components not shown in the figure can be air-cooled instead of liquid-cooled.

Mounting frame 202 is coupled to substrate 302 by mounting at least vertical support 204 to substrate 302. Angled support 206 is coupled to fixing channel 208 as described above, and a two-blade baffle unit such as baffle unit 100 is coupled to the mounting frame, with the second end of baffle blade 104 coupled to the fixing channel 210 of angled support 206. Operation of the illustrated baffle system is as described above in connection with FIGS. 1A-1C.

Baffle system 200 is assembled on the right-hand side of the cold plate, which is the direction from which the incident airflow approaches the cold plate. The mounting location of the baffle system is next to the cold plate/cold plates, while the baffle blade is implemented form the airflow inlet. It is not highly dependent on the PCB or chassis/system layout or space/footprint availability. This shows that the extensible mounting frame can be mounted to different locations, thus eliminating dependency on the PCB or chassis layouts. The baffle blades form a blocking path for the airflow, and the air path is optimized to minimize its impact on the airflow. Fixing channels on the mounting frame enable adjustment between the two supports as well as between the rotating structure and one of the mounting frame (the inclined one as shown in FIG. 3). In an embodiment, there may be multiple angled supports 206 for more complex structural environment.

FIG. 4 illustrates an embodiment of a hybrid cooling system 400 using an embodiment of a single-blade baffle unit. In hybrid cooling system 400, a pair of processors or other heat-generating electronic components 404a and 404b are mounted on a substrate 402. In one embodiment substrate 402 can be a printed circuit board, but in other embodiments it can be another kind of substrate. A cold plate 406 is thermally coupled to each component 404—cold plate 406a to component 404a, and cold plate 406b to component 404b—so that heat can be transferred from each heat-generating component 404 into liquid flowing through its corresponding cold plate 406. Although not shown in the drawings, other fluid components (e.g., hoses, pumps, heat exchangers, valves, etc.) are coupled to cold plates 406a and 406b to circulate cooling fluid through the cold plates.

A single-blade baffle unit 408 is mounted on the leading edge of substrate 402 (i.e., the edge of the substrate closest to the source of incident airflow, or the edge on which the incident flow first impinges). Baffle unit 408 is a single-blade embodiment of baffle unit 100 (see FIGS. 1A-1B), with rotation structure 102 mounted on substrate 402 and baffle blade 106 extending from the rotation structure. In one embodiment, baffle unit 408 can be mounted using the mounting frame 202 shown in FIGS. 2A-2B, but in other embodiments baffle unit 408 can be mounted differently. In other embodiments, baffle unit 408 can be implemented on another element such as a server chassis instead of on the printed circuit board 402 (see, e.g., FIG. 7).

In operation, airflow over the system 400 encounters baffle unit 408 and exerts an aerodynamic force on baffle blade 106 that is balanced by the elastic member within rotation unit 102. In one embodiment the airflow source of the can be natural convection, but in other embodiments the airflow can be forced convection driven by an element such as a fan. When the baffle blade is in its equilibrium position (i.e., aerodynamic force in the direction of airflow=component of elastic restoring force in the direction opposite to the airflow), baffle blade 106 diverts the airflow over one or both of cold plates 406b and 406a, reducing or preventing flow over the surfaces of the cold plates and thus reducing the extraction of heat from the cold plates that should stay within the liquid flowing through the cold plates for better cooling efficiency.

FIG. 5 illustrates an embodiment of a hybrid cooling system 500 using an embodiment of a single-blade baffle unit. As in hybrid system 400, in hybrid cooling system 500 a pair of processors or other heat-generating electronic components 404a and 404b are mounted on a substrate 402. In one embodiment substrate 402 can be printed circuit board, but in other embodiments it can be some other kind of substrate. A cold plate 406 is thermally coupled to each component 404—cold plate 406a to component 404a, and cold plate 406b to component 404b—to transfer heat from each heat-generating component 404 into liquid flowing through its corresponding cold plate 406. Although not shown in the drawings, other fluid components (e.g., hoses, pumps, heat exchangers, valves, etc.) are coupled to cold plates 406a and 406b to circulate cooling fluid through the cold plates.

The primary difference between hybrid cooling systems 500 and 400 is that hybrid cooling system 500 includes more baffle units and positions them differently, illustrating that the baffle units can be adjusted based on actual uses and that the design can be adapted to an existing system without modification of the existing system. In addition, the variety of implementation methods can enable more flexible methods for applying the design according to different uses.

In system 500, a single-blade baffle unit 502a is mounted on the leading edge of cold plate 406a (i.e., the edge of the cold plate closest to the incident flow, or the edge of the cold plate on which the incident flow first impinges) and a single-blade baffle unit 502b is mounted on the leading edge of cold plate 406b. In the illustrated embodiment both baffle units 502a and 502b are single-blade embodiments of baffle unit 100 (see FIGS. 1A-1B), with rotation structure 102 mounted on cold plates 406a and 406b and corresponding baffle blades 106a and 106b extending from the rotation structure. Other embodiments need not use to baffle units, but instead can use only a single baffle unit, positioned on cold plate 406a or cold plate 406b. Other embodiments also need not use single-blade baffle units but can instead use multi-blade baffle units as shown in FIGS. 1A-1C. In one embodiment, baffle units 502a-502b can be mounted using the mounting frame 202 shown in FIGS. 2A-2B, but in other embodiments baffle units 502a-502b can be mounted differently.

In operation, airflow over system 500 encounters baffle unit 502b and exerts an aerodynamic force on baffle blade 106b that is balanced by the elastic member within rotation unit 102. In one embodiment the airflow source of the can be natural convection, but in other embodiments the airflow can be forced convection driven by an element such as a fan. When baffle blade 106b is in its equilibrium position (i.e., aerodynamic force in the direction of airflow=component of elastic restoring force in the direction opposite to the airflow), baffle blade 106b diverts the airflow over cold plates 406b. The flow then travels until it encounters baffle unit 502a which uses baffle blade 106a to divert airflow over cold plate 406a. Baffle units 502a and 502b thus prevent airflow over the surfaces of their respective cold plates, thus reducing or preventing convective extraction of heat from the cold plates that should stay within the liquid flowing through the cold plates for better cooling efficiency.

Figure 6:
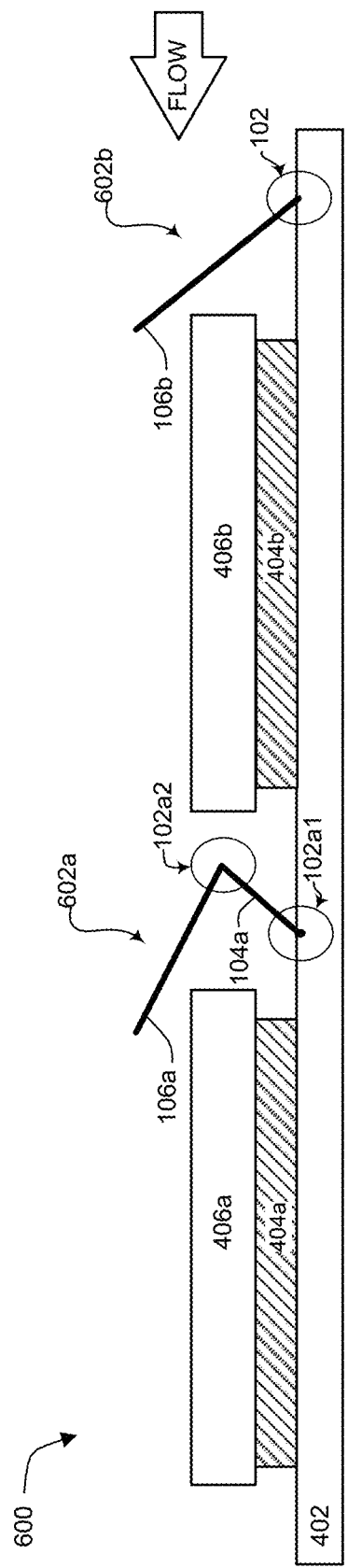
FIG. 6 is a side view of another embodiment of baffle units on a mounted substrate adjacent to electronic components coupled to cooling plates.

FIG. 6 illustrates an embodiment of a hybrid cooling system 600 using embodiment of a single-blade baffle unit and an embodiment of a multi-blade baffle unit. As in hybrid system 500, in hybrid cooling system 600 a pair of processors or other heat-generating electronic components 404a and 404b are mounted on a substrate 402. In one embodiment substrate 402 can be printed circuit board, but in other embodiments it can be some other kind of substrate. A cold plate 406 is thermally coupled to each component 404—cold plate 406a to component 404a, and cold plate 406b to component 404b—to transfer heat from each heat-generating component 404 into liquid flowing through its corresponding cold plate 406. Although not shown in the drawings, other fluid components (e.g., hoses, pumps, heat exchangers, valves, etc.) are coupled to cold plates 406a and 406b to circulate cooling fluid through the cold plates.

The primary difference between hybrid cooling systems 600 and 500 is that hybrid cooling system 600 uses different baffle units and positions them differently, illustrating one way the system can be adjusted based on actual use. The illustrated embodiment might require different types of mounting methods for achieving optimal airflow management, but this shows that the design can be implemented in an existing system without any need to modify the existing system.

In system 600, a multi-blade baffle unit 602a is mounted on substrate 402 ahead of cold plate 406a (i.e., the on the side of the cold plate closest to the origin of the incident airflow) and a single-blade baffle unit 602b is mounted on substrate 402 ahead of cold plate 406b. In the illustrated embodiment baffle unit 602a is an embodiment of baffle unit 100 that includes two rotational units 102a1 and 102a2 and two baffle blades 104a and 106a. Rotational unit 102a1 is positioned on the surface of substrate 402 and coupled to the second edge of baffle blade 104. The first edge of baffle blade 104 and the first edge of baffle blade 106 are coupled to rotational unit 102a2. In one embodiment, baffle units 602a-602b can be mounted using the mounting frame 202 shown in FIGS. 2A-2B, but in other embodiments baffle units 602a-602b can be mounted differently.

Baffle unit 602b is a single-blade embodiments of baffle unit 100 (see FIGS. 1A-1B), with rotation structure 102b positioned on substrate 402 and baffle blade 106b extending from the rotation structure. Other embodiments of system 600 need not use two baffle units, but can instead use only a single baffle unit positioned on substrate 402 (see, e.g., FIG. 3). Other embodiments also need not use single-blade baffle units but can instead use multi-blade baffle units as shown in FIGS. 1A-1C.

In operation, airflow over system 600 encounters baffle unit 602b and exerts an aerodynamic force on baffle blade 106b. The aerodynamic force is balanced by the elastic member within rotation unit 102. In one embodiment the airflow source can be natural convection, but in other embodiments the airflow source can be forced convection driven by an element such as a fan. When baffle blade 106*b* is in its equilibrium position (i.e., when aerodynamic force in the direction of airflow=component of elastic restoring force in the direction opposite to the airflow), baffle blade 106*b* diverts the airflow over cold plate 406*b*. The airflow travels in the flow direction until it encounters baffle unit 602*a*, which diverts airflow over cold plate 406*a*. Baffle units 602*a* and 602*b* thus prevent airflow over the surfaces of their respective cold plates, and reduce or prevent convective extraction of heat that should remain in the liquid flowing through the cold plates for better cooling efficiency.

Figure 7:
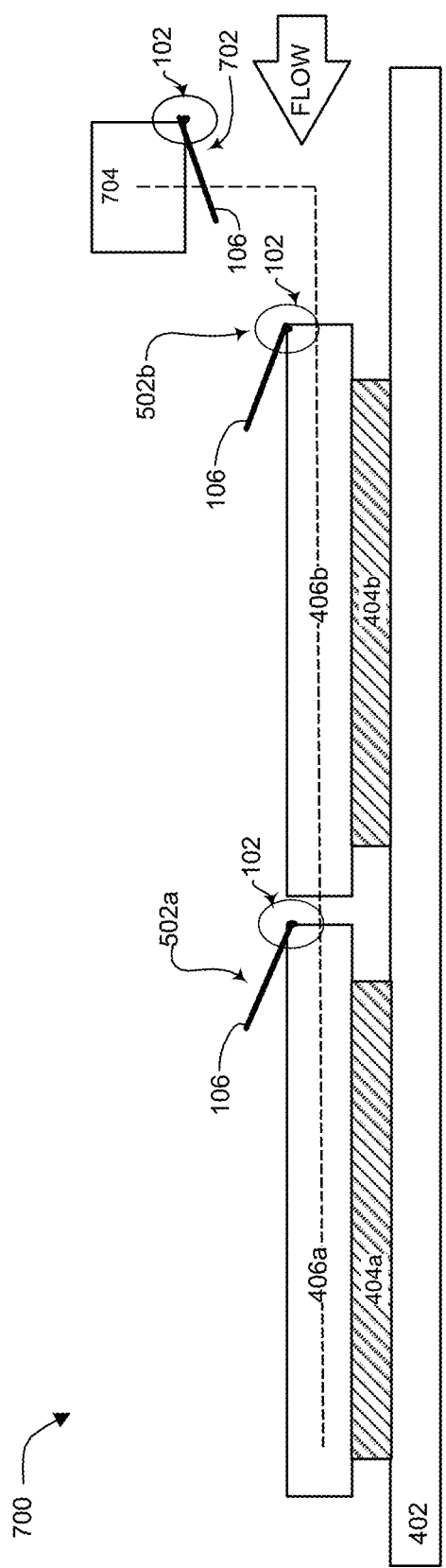
FIG. 7 is a side view of another embodiment of baffle units mounted on a substrate adjacent to electronic components with cooling plates.

FIG. 7 illustrates an embodiment of a hybrid cooling system 700 using an embodiment of a single-blade baffle unit. As in hybrid system 500, in hybrid cooling system 700 a pair of processors or other heat-generating electronic components 404*a* and 404*b* are mounted on a substrate 402. In one embodiment substrate 402 can be printed circuit board, but in other embodiments it can be some other kind of substrate. A cold plate 406 is thermally coupled to each component 404—cold plate 406*a* to component 404*a*, and cold plate 406*b* to component 404*b*—to transfer heat from each heat-generating component 404 into liquid flowing through its corresponding cold plate 406. Although not shown in the drawings, other fluid components (e.g., hoses, pumps, heat exchangers, valves, etc.) are coupled to cold plates 406*a* and 406*b* to circulate cooling fluid through the cold plates.

The primary difference between hybrid cooling systems 700 and 500 is that hybrid cooling system 700 includes additional baffles beyond those mounted on cold plates 406*a*-406*b*. This may require different types of mounting methods. However, this further shows that the design can be implanted to an existing system without any modification requirement on the existing system.

As in system 500, in system 700 a single-blade baffle unit 502*a* is mounted on the leading edge of cold plate 406*a* (i.e., the edge of the cold plate closest to the incident flow, or the edge of the cold plate on which the incident flow first impinges) and a single-blade baffle unit 502*b* is mounted on the leading edge of cold plate 406*b*.

In the illustrated embodiment both baffle units 502*a* and 502*b* are single-blade embodiments of baffle unit 100 (see FIGS. 1A-1B), with rotation structure 102 mounted on cold plates 406*a* and 406*b* and baffle blade 106 extending from the rotation structure. Other embodiments need not use to baffle units, but instead can use only a single baffle unit, positioned on cold plate 406 or cold plate 406*b*. Other embodiments also need not use single-blade baffle units but can instead use multi-blade baffle units as shown in FIGS. 1A-1C.

In addition to baffle units 502*a*-502*b*, system 700 includes one or more additional baffles 702 that can be mounted to a component 704 other than substrate 402 or cold plates 406*a*-406*b*. In one embodiment, component 704 can be a cooling component 704, but other embodiments it can be a different type of component such as a server chassis or rack. In one embodiment, baffle unit 702 can be mounted to component 704 using the mounting frame 202 shown in FIGS. 2A-2B, but in other embodiments baffle unit 702 can be mounted differently. In addition, multi-devices implementations such as systems 700 and 500 can accommodate structural interference from liquid cooling loops. Comparing to the one shown in FIG. 2A, smaller devices can be implemented on individual cold plates.

In operation, baffle unit 702 works together with baffle units 502*a*-502*b*, as described above for system 500, to limit or prevent convective heat transfer to the airflow from cold plates 406*a*-406*b*.

Other baffle embodiments are possible besides the ones described above. For instance:

The mounting method of the device can be different and might require additional components or structure.

Different elastic structures or mechanisms can be used in the rotation structure.

Different flexible structures can be used for designing the mounting structure.

The above description of embodiments is not intended to be exhaustive or to limit the invention to the described forms. Specific embodiments of, and examples for, the invention are described herein for illustrative purposes, but various modifications are possible.

What is claimed is:

1. A baffle unit comprising:
    an elastic member;
    one or more baffle blades, each baffle blade having a first edge and a second edge, the second edge being spaced apart from the first edge, wherein each baffle blade has its first edge coupled to the elastic member, wherein each baffle blade rotates about and deforms the elastic member in response to aerodynamic forces applied to the one or more baffle blades, and wherein the second edge of one of the one or more baffle blades is fixed or rotatably fixed; and
    an additional elastic member coupled to the second edge of one of the one or more baffle blades.

2. The baffle unit of claim 1, further comprising a shaft having a shaft axis and being centrally positioned in the elastic member, wherein each baffle blade has its first edge coupled to the shaft, so that each baffle blade is rotatable about the shaft axis in response to the aerodynamic forces.

3. The baffle unit of claim 1 wherein each baffle blade is quadrilateral and has a pair of long edges and a pair of short edges, and wherein one of the pair of long edges is the first edge and the other of the pair of long edges is the second edge.

4. The baffle unit of claim 1, further comprising an additional baffle blade having a first edge and a second edge, wherein the first edge of the additional baffle blade is coupled to the additional elastic member.

5. The baffle unit of claim 1 wherein the second edge of one of the one or more baffle blades is fixed.

6. A baffle system comprising:
    a mounting structure adapted to be mounted to a substrate; and
    a baffle unit coupled to the mounting structure, the baffle unit comprising:
    an elastic member, and
    one or more baffle blades, each baffle blade having a first edge and a second edge, the second edge being spaced apart from the first edge, wherein each baffle blade has its first edge coupled to the elastic member, so that each baffle blade rotates about and deforms the elastic member in response to aerodynamic forces applied to the one or more baffle blades,
    wherein the second edge of one of the one or more baffle blades is fixed to the mounting structure, and
    wherein the mounting structure comprises:
        a vertical support having a fixing channel therein, and
        an angled support having a fixing channel therein, wherein an end of the angled support is movably coupled to the fixing channel of the vertical support.

7. The baffle system of claim 6 wherein the second edge of one of the one or more baffle blades is fixed to the fixing channel of the angled support.

8. The baffle system of claim 6 wherein the end of the angled support that is movably coupled to the fixing channel of the vertical support can move within the fixing channel to change the angle of the angled support relative to the vertical support.

9. The baffle system of claim 6 wherein the baffle unit further comprises a shaft having a shaft axis and being centrally positioned in the elastic member, wherein each baffle blade has its first edge coupled to the shaft, so that each baffle blade is rotatable about the shaft axis in response to aerodynamic forces applied to the baffle blade.

10. A hybrid cooling system comprising:
   a substrate including one or more heat-generating electronic components mounted thereon;
   a liquid cooling system including cold plates coupled to at least one of the one or more heat-generating components;
   an airflow source to direct airflow over the substrate; and
   one or more baffle units coupled to the substrate, to one or more cold plates, or to both the substrate and to one or more cold plates, each baffle unit including:
      an elastic member, and
      one or more baffle blades, each baffle blade having a first edge and a second edge, wherein each baffle blade has its first edge coupled to the elastic member, so that each baffle blade rotates about and deforms the elastic member in response to aerodynamic forces applied by the airflow to the one or more baffle blades.

11. The hybrid cooling system of claim 10 wherein at least one of the one or more baffle units is coupled to a leading edge of the substrate.

12. The hybrid cooling system of claim 10 wherein at least one of the one or more baffle units is coupled to a leading edge of at least one of the one or more cold plates.

13. The hybrid cooling system of claim 10 wherein the one or more baffle units include multiple baffle units, each baffle unit coupled to the substrate upstream of each cold plate.

14. The hybrid cooling system of claim 10 wherein at least one of the one or more baffle units is coupled to the substrate or to one or more cold plates by a mounting structure comprising:
   a vertical support having a fixing channel therein; and
   an angled support having a fixing channel therein, wherein an end of the angled support is movably coupled to the fixing channel of the vertical support.

15. The hybrid cooling system of claim 14 wherein the second edge of one of the one or more baffle blades is fixed to the fixing channel of the angled support.

16. The hybrid cooling system of claim 14 wherein the end of the angled support that is movably coupled to the fixing channel of the vertical support can move within the fixing channel to change the angle of the angled support relative to the vertical support.

17. A baffle system comprising:
   a mounting structure adapted to be mounted to a substrate; and
   a baffle unit coupled to the mounting structure, the baffle unit comprising:
      an elastic member,
      one or more baffle blades, each baffle blade having a first edge and a second edge, the second edge being spaced apart from the first edge, wherein each baffle blade has its first edge coupled to the elastic member, so that each baffle blade rotates about and deforms the elastic member in response to aerodynamic forces applied to the one or more baffle blades, and wherein the second edge of one of the one or more baffle blades is fixed to the mounting structure, and
      an additional elastic member coupled to the second edge of one of the one or more baffle blades.

18. The baffle system of claim 17 wherein the baffle unit further comprises an additional baffle blade having a first edge and a second edge, wherein the first edge of the additional baffle blade is coupled to the additional elastic member.

* * * * *